(12) United States Patent
Yeh et al.

(10) Patent No.: US 7,672,126 B2
(45) Date of Patent: Mar. 2, 2010

(54) MOUNTING APPARATUS FOR FAN

(75) Inventors: Chin-Wen Yeh, Taipei Hsien (TW); Zhen-Neng Lin, Shenzhen (CN)

(73) Assignees: Hong Fu Jin Precision Indsutry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 137 days.

(21) Appl. No.: 11/947,780

(22) Filed: Nov. 30, 2007

(65) Prior Publication Data

US 2009/0141449 A1 Jun. 4, 2009

(51) Int. Cl.
 *H05K 7/20* (2006.01)
 *F04D 29/64* (2006.01)

(52) U.S. Cl. .............. 361/695; 361/679.48; 415/213.1; 417/423.15; 24/297; 403/397

(58) Field of Classification Search ............ 361/679.46, 361/679.48, 694–695; 165/80.3; 174/16.3; 454/184; 24/297, 453, 455, 457–459; 403/326, 403/329, 397; 411/508, 913; 415/126, 213.1, 415/214.1; 417/423.15
See application file for complete search history.

(56) References Cited

U.S. PATENT DOCUMENTS

| | | | | |
|---|---|---|---|---|
| 5,590,025 A * | 12/1996 | Clemens | ..................... | 361/695 |
| 5,677,829 A * | 10/1997 | Clemens | ..................... | 361/697 |
| 6,017,185 A * | 1/2000 | Kuo | ........................... | 415/177 |
| 6,118,657 A * | 9/2000 | Clemens | ..................... | 361/697 |
| 6,215,659 B1 | 4/2001 | Chen | | |
| 6,311,766 B1 * | 11/2001 | Lin et al. | .................. | 165/80.3 |
| 6,341,644 B1 * | 1/2002 | Lo et al. | ..................... | 165/80.3 |
| 6,392,885 B1 * | 5/2002 | Lee et al. | .................... | 361/697 |
| 6,485,260 B2 * | 11/2002 | Orlowski et al. | ......... | 415/213.1 |
| 6,520,250 B2 * | 2/2003 | Lee et al. | .................... | 165/121 |
| 6,579,062 B2 * | 6/2003 | Lu et al. | ................. | 415/213.1 |
| 6,662,411 B2 * | 12/2003 | Rubenstein et al. | .......... | 24/453 |
| 6,749,398 B2 * | 6/2004 | Lu et al. | ................. | 415/121.2 |
| 7,369,408 B2 * | 5/2008 | Chang | ........................ | 361/697 |
| 2006/0045737 A1 * | 3/2006 | Wung et al. | ................. | 415/220 |
| 2006/0126302 A1 * | 6/2006 | Lee et al. | .................... | 361/704 |

* cited by examiner

*Primary Examiner*—Jayprakash N Gandhi
*Assistant Examiner*—Robert J Hoffberg
(74) *Attorney, Agent, or Firm*—Frank R. Niranjan

(57) ABSTRACT

A mounting apparatus is used to mount a fan having a bottom panel with a mounting hole defined therein. The mounting apparatus is configured to support the bottom panel on a top side thereof. The board forms a clip on the top side of the board, and defines a through hole adjacent the clip. The clip includes a elastic shank standing on the top side of the board, a flange formed on a top end of the shank and suspended over the shank, and a driving pole extending downwards from the shank and through the through hole of the board to have a driving end of the driving pole located below the board adapted to bend the shank. The clip is inserted in the mounting hole of the bottom panel with the flange engaging on a top surface of the bottom panel. The bottom panel is sandwiched between the flange and the top side of the board. The driving end of the driving pole is manually bendable to disengage the flange of the clip from the top surface of the bottom panel.

12 Claims, 4 Drawing Sheets

MOUNTING APPARATUS FOR FAN

BACKGROUND

1. Technical Field

The present invention relates to mounting apparatus for fans, and particularly to a mounting apparatus which can conveniently and firmly secure a fan to a computer enclosure.

2. Description of related art

A typical contemporary personal computer includes a central processing unit (CPU) and a power supply. Heat generated by the CPU is removed by a fan attached to the CPU. There is usually a fan in the power supply to assist in cooling the power supply as well.

Components are being mounted in computer enclosures in greater numbers than ever before, and these components not only generate heat in the computer enclosures, but also block air flow, so fans are often installed in the computer enclosures to assist in cooling the computer enclosure. The fans are generally mounted in the computer enclosures by screws, which require using a screwdriver. The attachment procedure is unduly tedious and inconvenient, especially when the enclosure is small. Furthermore, other components in the enclosure are prone to be accidentally damaged during the attachment procedure.

Another conventional means of attachment of a fan to a computer enclosure is to use a fan holder. The fan holder includes four lateral spring hooks and two longitudinal spring hooks. An enclosure defines four lateral and two longitudinal slots therein. The hooks respectively extend through the slots of the enclosure and engage therein. Thus, the fan is fastened to the enclosure. The fan holder does not require screws. However, the fan holder is not easily removed from the enclosure when maintenance or replacement is required.

What is needed, therefore, is an improved mounting apparatus for a fan which solves the above-mentioned problems.

SUMMARY

A mounting apparatus is used to mount a fan having a bottom panel with a mounting hole defined therein. The mounting apparatus is configured to support the bottom panel on a top side thereof. The board forms a clip on the top side of the board, and defines a through hole adjacent the clip. The clip includes a elastic shank standing on the top side of the board, a flange formed on a top end of the shank and suspended over the shank, and a driving pole extending downwards from the shank and through the through hole of the board to have a driving end of the driving pole located below the board adapted to bend the shank. The clip is inserted in the mounting hole of the bottom panel with the flange engaging on a top surface of the bottom panel. The bottom panel is sandwiched between the flange and the top side of the board. The driving end of the driving pole is manually bendable to disengage the flange of the clip from the top surface of the bottom panel.

Other advantages and novel features of the present invention will become more apparent from the following detailed description of preferred embodiment when taken in conjunction with the accompanying drawings, in which:

DETAILED DESCRIPTION OF THE EMBODIMENT

Figure 1:
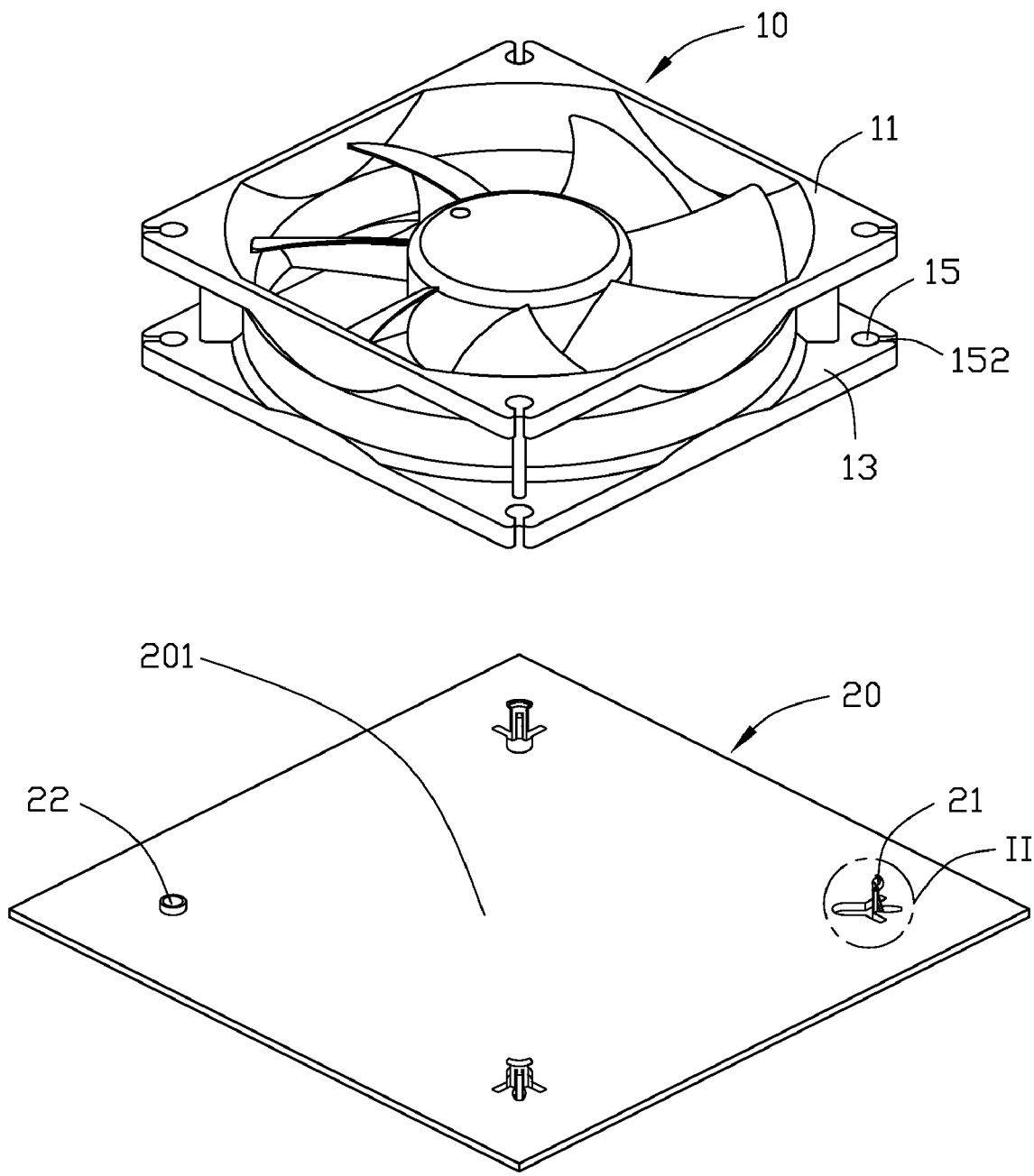
FIG. 1 is an exploded, isometric view of a mounting apparatus for mounting a fan.

Referring to FIG. 1, a mounting apparatus is used to mount a fan 10 onto a board 20 of a computer enclosure.

The fan 10 includes a top panel 11 and a bottom panel 13 parallel to the top panel 11. Each of the four corners of the bottom panel 13 defines a mounting hole 15 and a cutout 152 communicating with the mounting hole 15 therein. Each cutout 152 is defined between the corresponding mounting hole 15 and the edges of the bottom panel 13.

Figure 2:
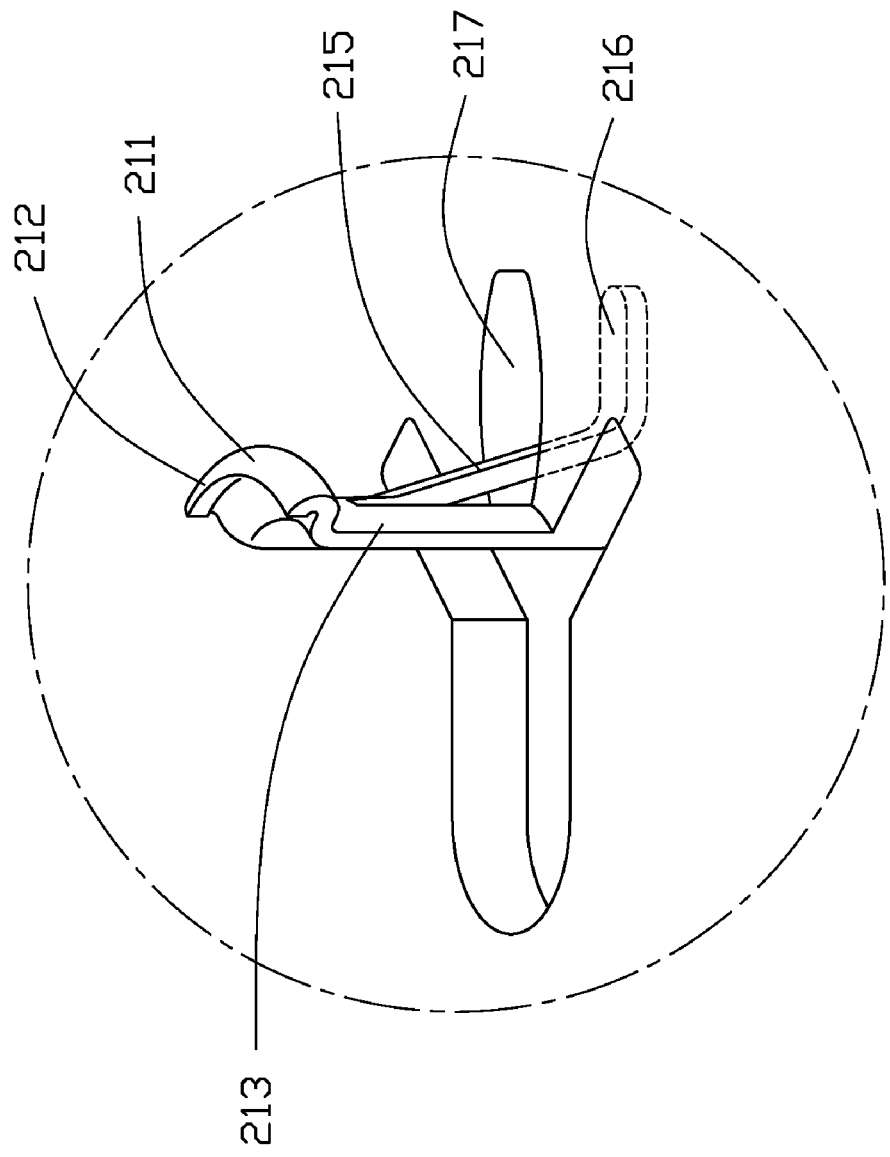
FIG. 2 is an enlarged view of circled portion II of FIG. 1.

Referring to FIGS. 1 and 2, the board 20 forms three clips 21 and a positioning post 22 on a top side 201 thereof corresponding to the four mounting holes 15 of the fan 10. Each clip 21 includes a shank 213 protruding upwards from the board 20. A flange 211 with a smoothly arced outer surface 212 is formed on and suspended over a top end of the shank 213. A driving pole 215 is connected to the shank 213 and extends downwards from the shank 213 and through a through hole 217 defined in the board 20. A driving end 216 is formed on the free end of the driving pole 215 and located below a bottom of the board 20. A width of the shank 213 is smaller than a diameter of the mounting hole 15 of the fan 10, and larger than a width of the cutout 152. A width of the driving pole 215 is smaller than the width of the cutout 152.

Figure 3:
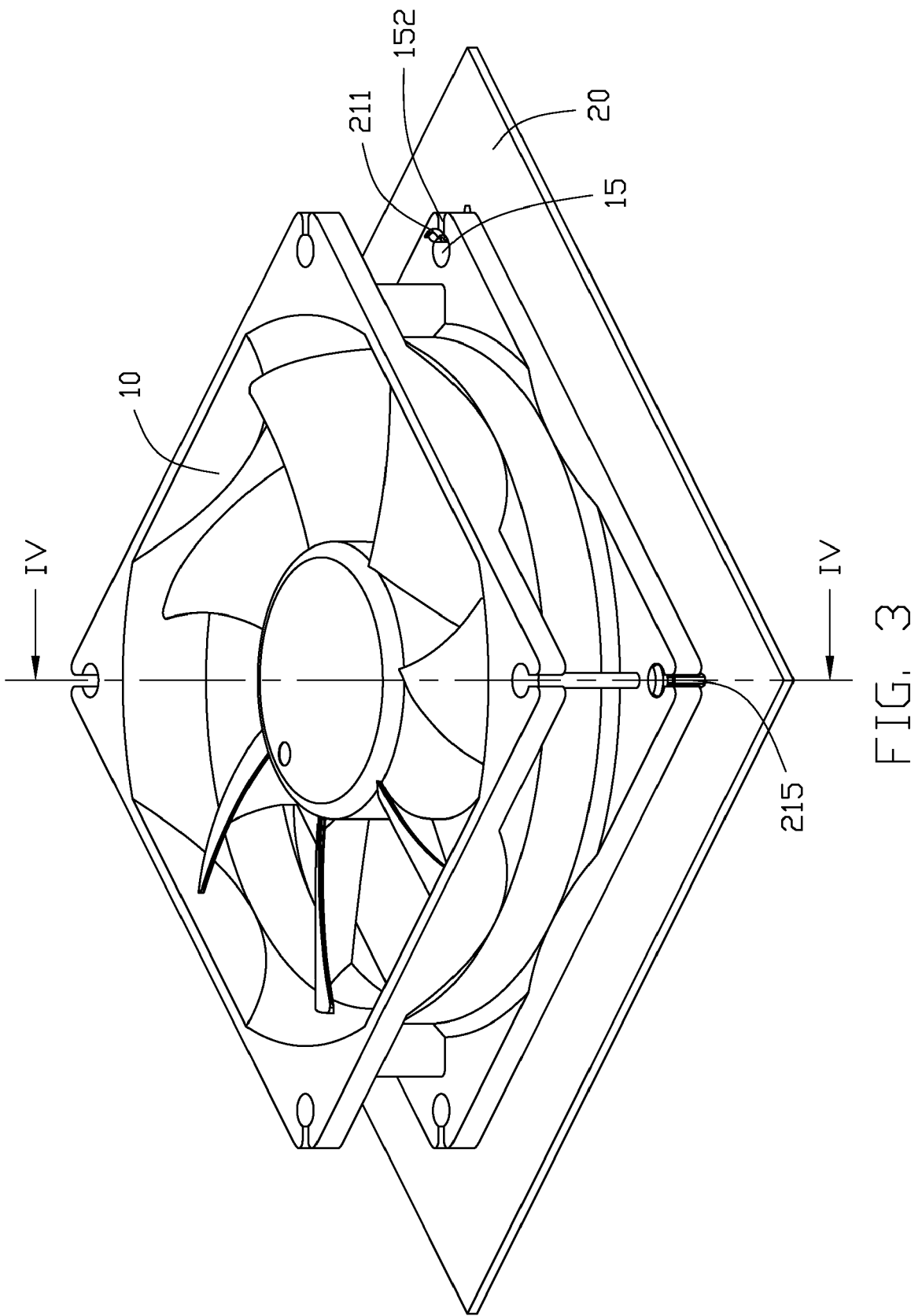
FIG. 3 is an assembled view of the fan being mounted.
Figure 4:
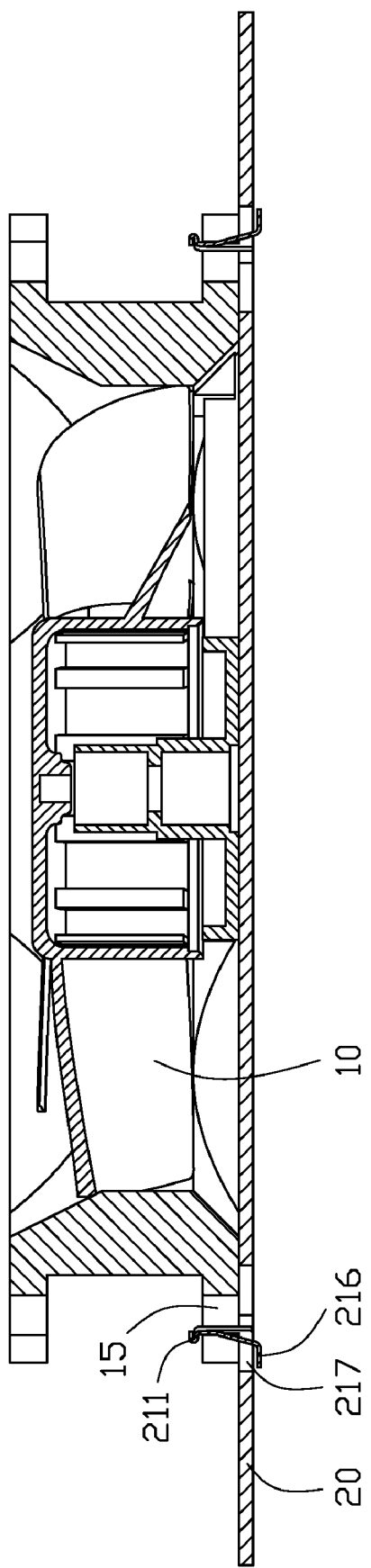
FIG. 4 is a cross-sectional view taken along lines IV-IV of FIG. 3.

Referring to FIGS. 3 and 4, in assembly of the fan 10 on the board 20, the mounting holes 15 of the fan 10 are aligned with the clips 21 and the positioning post 22 of the board 20 respectively. The fan 10 is then moved towards the board 20. Each clip 21 is inserted into the corresponding mounting hole 15. The outer surface 212 of the flange 211 engages with the edges of the corresponding mounting hole 15, and is pressed by the edges of the mounting hole 15, so the shank 213 is bent towards a center of the mounting hole 15. The fan 10 moves towards the board 20 until the edges of the mounting hole 15 slides over the flange 211 of the clip 21. The shank 213 rebounds to have the flange 211 engaging on the top surface of the bottom panel 13. The driving pole 215 of the clip 21 is received in the cutout 152. The bottom panel 13 of the fan 10 is then placed on the board 20. So the bottom panel 13 of the fan 10 is sandwiched between the flanges 211 of the clips 21 and the top side 201 of the board 20. Simultaneously, the positioning post 22 is inserted in one mounting hole 15 of the fan 10. Therefore, the fan 10 is mounted on the board 20.

In disassembly of the fan 10 from the board 20, the driving ends 216 of the driving poles 215 are pushed to bend the shanks 213 of the clips 21. The flanges 211 of the clips 21 disengage from the top surface of bottom panel 13, so the fan 10 can be detached from the board 20.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A mounting apparatus for a fan, the fan having a bottom panel, the bottom panel defining a mounting hole, the mounting apparatus comprising:

a board configured to support the bottom panel thereon, the board forming a clip on a top side of the board corresponding to the mounting hole of the bottom panel, and defining a through hole adjacent the clip, the clip comprising an elastic shank standing on the top side of the board, and a flange formed on a top end of the shank and suspended over the shank, a driving pole extending downwards from the shank and through the through hole of the board to have a driving end of the driving pole located below the board;

wherein the clip is inserted in the mounting hole of the bottom panel with the flange resiliently abutting against edges of the mounting hole and engaging on a top surface of the bottom panel, the bottom panel being sandwiched between the flange and the top side of the board, the driving end of the driving pole being manually bendable to disengage the flange of the clip from the top surface of the bottom panel, and the bottom panel defines a cutout communicating with the mounting hole, the driving pole of the clip is received in the cutout.

2. The mounting apparatus as described in claim 1, wherein a width of the clip is smaller than a diameter of the mounting hole, and larger than a width of the cutout.

3. The mounting apparatus as described in claim 1, wherein the flange comprises a smoothly arced outer surface for conveniently sliding over the edges of the mounting hole.

4. An assembly, comprising:
a fan comprising a bottom panel, the bottom panel defining a mounting hole; and
a board supporting the bottom panel of the fan thereon, the board comprising a clip, the clip comprising an elastic shank inserted in the mounting hole and a flange formed on the shank to engage with a top surface of the bottom panel to sandwich the bottom panel of the fan between the flange and the board, a driving pole connected with the shank for bending the shank to disengage the flange from the top surface of the bottom panel; and
wherein the bottom panel defines a cutout communicating with the mounting hole, the driving pole of the clip is received in the cutout when the flange is received in the mounting hole.

5. The assembly as described in claim 4, wherein the board defines a through hole adjacent the clip, the driving pole extends downwards from the shank and through the through hole of the board to have a driving end of the driving pole located below the board.

6. The assembly as described in claim 4, wherein the flange is formed on a top end of the shank and suspended over the shank to engage with edges of the mounting hole to bend the shank when the shank is inserted in the mounting hole.

7. The assembly as described in claim 6, wherein the flange comprises a smoothly arced outer surface for conveniently sliding over the edges of the mounting hole.

8. The mounting apparatus as described in claim 4, wherein a width of the clip is smaller than a diameter of the mounting hole, and larger than a width of the cutout.

9. A fan assembly comprising:
a fan comprising a bottom panel, the bottom panel defining a plurality of mounting holes, and a plurality of cutouts in peripheral edges thereof, the cutouts being in communication with the respective mounting through holes; and
a board with the fan mounted thereon, the board comprising a plurality of clips, each of the clips comprising an elastic shank inserted in the mounting through hole and a catch flange formed at a distal end of the shank, and a driving pole connected with the shank and extending downwardly from the shank, a distal end of the driving pole located at an opposite side of the board to the fan, the catch flange engaging with a top surface of the bottom panel, the driving pole being received in the respective cutouts of the bottom panel.

10. The assembly as described in claim 9, wherein the board defines a plurality of through hole adjacent the clip, the driving pole extends downwards from the shank and through the through hole of the board to have a driving end of the driving pole located at an opposite side of the board to the fan.

11. The assembly as described in claim 9, wherein the flange comprises a smoothly arced outer surface for conveniently sliding over the edges of the mounting hole.

12. The mounting apparatus as described in claim 9, wherein a width of the clip is smaller than a diameter of the mounting hole, and larger than a width of the cutout.

* * * * *